United States Patent
Genmei (10) Patent No.: US 10,232,674 B2
(45) Date of Patent: Mar. 19, 2019

(54) PIEZOELECTRIC SENSOR AND PIEZOELECTRIC ELEMENT

(71) Applicant: Murata Manufacturing Co., Ltd., Nagaokakyo-shi, Kyoto-fu (JP)

(72) Inventor: Yuya Genmei, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 317 days.

(21) Appl. No.: 15/386,148

(22) Filed: Dec. 21, 2016

(65) Prior Publication Data

US 2017/0190227 A1 Jul. 6, 2017

Related U.S. Application Data

(63) Continuation of application No. PCT/JP2015/057866, filed on Mar. 17, 2015.

(30) Foreign Application Priority Data

Jul. 4, 2014 (JP) .................. 2014-138751

(51) Int. Cl.
*B60C 23/06* (2006.01)
*G01L 9/08* (2006.01)
(Continued)

(52) U.S. Cl.
CPC .......... *B60C 23/064* (2013.01); *G01L 9/0076* (2013.01); *G01L 9/08* (2013.01);
(Continued)

(58) Field of Classification Search
CPC .. G01M 17/02; G01M 17/021; G01M 17/022; G01M 17/027; G01M 17/025; G01M 17/024; G01M 17/10; G01M 7/08; G01M 17/0076; G01M 17/013; G01M 17/03; G01M 17/04; G01M 17/06; G01M 17/08; G01M 1/02; G01M 1/045; G01M 1/12; G01M 1/225; G01M 3/04;
(Continued)

(56) References Cited

U.S. PATENT DOCUMENTS 5,786,655 A * 7/1998 Okumura ............ H01L 41/0471
310/328
2002/0060507 A1* 5/2002 Cuhat .................. H01L 41/047
310/319
(Continued)

FOREIGN PATENT DOCUMENTS

JP 62-156503 A 7/1987
JP 2000-114912 A 4/2000
(Continued)

OTHER PUBLICATIONS

Official Communication issued in corresponding International Application PCT/JP2015/057866, dated Apr. 21, 2015.

*Primary Examiner* — Andre J Allen
(74) *Attorney, Agent, or Firm* — Keating & Bennett, LLP (57) ABSTRACT

A piezoelectric sensor includes a substrate and a piezoelectric element, and at least a pair of mounting electrodes on one main surface of the substrate. The piezoelectric element includes a laminate including a first terminal electrode and a second terminal electrode respectively bonded to the mounting electrodes by bonding materials.

17 Claims, 9 Drawing Sheets

(51) Int. Cl.
*G01L 17/00* (2006.01)
*G01L 9/00* (2006.01)
*H01L 41/047* (2006.01)
*H01L 41/113* (2006.01)
*B60C 19/00* (2006.01)

(52) U.S. Cl.
CPC .......... *G01L 17/00* (2013.01); *H01L 41/0471* (2013.01); *H01L 41/1132* (2013.01); *B60C 2019/004* (2013.01)

(58) Field of Classification Search
CPC ........ G01M 3/40; G01M 5/0091; G01M 7/02; G01M 99/00; G01M 99/002; B60C 23/0494; B60C 23/04; B60C 23/0493; B60C 2019/004; B60C 19/00; B60C 23/0498; B60C 23/064; B60C 23/0488; B60C 23/0496; B60C 23/0408; B60C 23/041; B60C 23/0411; B60C 23/20; B60C 11/243; B60C 11/246; B60C 23/06; B60C 23/061; B60C 23/00; B60C 23/0486; B60C 11/0083; B60C 13/003; B60C 2009/2038; B60C 23/003; B60C 23/004; B60C 23/02; B60C 23/0401; B60C 23/0406; B60C 23/0416; B60C 23/0433; B60C 23/0455; B60C 23/0489; B60C 23/0491; B60C 25/002; B60C 25/005; B60C 25/007; B60C 29/02; B60C 3/04; B60C 99/00; B60C 99/006; B60C 11/24; B60C 13/001; B60C 13/02; B60C 15/0036; B60C 17/02; B60C 2009/0071; B60C 2009/2022; B60C 2200/02; B60C 2200/06; B60C 2200/065; B60C 23/007; B60C 23/008; B60C 23/0413; B60C 23/0427; B60C 23/0447; B60C 23/0454; B60C 23/0459; B60C 23/0467; B60C 23/0471; B60C 23/0472; B60C 23/0474; B60C 23/0476; B60C 23/0484; B60C 23/065; B60C 23/066; B60C 23/10; B60C 25/0548; B60C 25/056; B60C 25/132; B60C 25/138; B60C 25/18; B60C 29/005; B60C 9/005; B60C 9/18; B60C 9/1807; B60C 9/20; B60C 9/28
USPC .................................................. 73/146–146.8
See application file for complete search history.

(56) References Cited

U.S. PATENT DOCUMENTS

| | | | |
|---|---|---|---|
| 2004/0084999 A1* | 5/2004 | Yamauchi | G01P 15/0922 310/328 |
| 2006/0028095 A1 | 2/2006 | Maruyama et al. | |
| 2011/0187239 A1 | 8/2011 | Feiel et al. | |
| 2013/0112010 A1 | 5/2013 | Matsumoto et al. | |
| 2014/0007682 A1* | 1/2014 | Kabasawa | G01O 19/56 73/504.12 |
| 2016/0155927 A1* | 6/2016 | Kabasawa | G01L 9/0073 257/419 |
| 2017/0190227 A1* | 7/2017 | Genmei | G01L 9/08 |
| 2017/0363409 A1* | 12/2017 | Genmei | G01B 7/16 |
| 2018/0226564 A1* | 8/2018 | Itayama | B06B 1/0629 |

FOREIGN PATENT DOCUMENTS

| | | | |
|---|---|---|---|
| JP | 2004128386 A | * | 4/2004 |
| JP | 2006-038710 A | | 2/2006 |
| JP | 2006-048302 A | | 2/2006 |
| JP | 2007-163230 A | | 6/2007 |
| JP | 2007-315958 A | | 12/2007 |
| JP | 2011-525046 A | | 9/2011 |
| JP | 2013-101020 A | | 5/2013 |

* cited by examiner

PIEZOELECTRIC SENSOR AND PIEZOELECTRIC ELEMENT

CROSS REFERENCE TO RELATED APPLICATIONS

This application claims the benefit of priority to Japanese Patent Application No. 2014-138751 filed on Jul. 4, 2014 and is a Continuation Application of PCT Application No. PCT/JP2015/057866 filed on Mar. 17, 2015. The entire contents of each application are hereby incorporated herein by reference.

BACKGROUND OF THE INVENTION

1. Field of the Invention

The present invention relates to a piezoelectric sensor and a piezoelectric element.

2. Description of the Related Art

Examples of a piezoelectric sensor for detecting a deflection include a piezoelectric sensor described in Japanese Unexamined Patent Application Publication No. 2007-163230. In this piezoelectric sensor, a piezoelectric substance such as aluminum nitride is formed into a thin-film shape on one main surface of a film-shaped flat substrate made of a flexible polymeric material such as polyimide, and electrode layers are provided on both main surfaces of the flat substrate including the piezoelectric substance on one of the main surfaces.

This piezoelectric sensor, which is in the form of a very thin film and is sufficiently flexible, is used in close contact with a curved portion, for example, the inner surface of a tire. Thus, the piezoelectric sensor can detect the deformation of a tire caused by, for example, the change in the inflation pressure of the tire.

However, the piezoelectric sensor described in Japanese Unexamined Patent Application Publication No. 2007-163230 has the following problems.

The piezoelectric sensor described in Japanese Unexamined Patent Application Publication No. 2007-163230 includes a thin-film piezoelectric substance and is directly bonded to a tire by using an adhesive. As a result, the piezoelectric sensor detects, in addition to a signal generated by the deformation of a tire due to the change in the inflation pressure of the tire, various signals caused by, for example, extraneous vibration and impact directly transmitted from the tire at the same time. Accordingly, in order to accurately detect only the deformation of the tire due to the change in the inflation pressure of the tire, a complex signal processing circuit is needed.

Since the piezoelectric sensor described in Japanese Unexamined Patent Application Publication No. 2007-163230 is directly bonded to a tire by using an adhesive, a peripheral circuit such as a signal processing circuit provided around the piezoelectric sensor is connected to the piezoelectric sensor by using, for example, many lead wires. The number of wires in the tire is therefore large. Since the wires are long, the pattern of the wires is complex. It is, therefore, difficult to mount another electronic component (e.g., an IC) on the piezoelectric sensor.

While a film-shaped piezoelectric sensor can be made very thin, the piezoelectric sensor needs to have a large area to increase sensitivity, and becomes large in size. If a tire is punctured by a sharp object such as a nail, a piezoelectric sensor itself and a peripheral circuit are likely to be damaged. In this case, the deformation of a tire cannot be detected.

SUMMARY OF THE INVENTION

A piezoelectric sensor according to a preferred embodiment of the present invention includes a substrate and a piezoelectric element. On one main surface of the substrate, mounting electrodes are provided. The piezoelectric element includes a laminate and first and second terminal electrodes that are disposed on different end surfaces of the laminate. The laminate includes a piezoelectric substance, first and second detection electrodes between which the piezoelectric substance is disposed, and an exterior body laminated on the outer side portion of at least one of the first and second detection electrodes. The first detection electrode is connected to the first terminal electrode. The second detection electrode is connected to the second terminal electrode. The first terminal electrode and the second terminal electrode are bonded to the respective mounting electrodes by a bonding material, so that the piezoelectric element is mounted on the substrate.

It is preferable for the first detection electrode to be extended from one of the end surfaces of the laminate and two side surfaces connected to the end surface and be connected to the first terminal electrode. It is preferable for the second detection electrode to be extended from the other one of the end surfaces of the laminate and two side surfaces connected to the end surface and be connected to the second terminal electrode. In this case, the connection between a detection electrode and a terminal electrode is able to be securely and reliably established.

A gap is preferably provided between the substrate and the piezoelectric element. In this case, the gap contributes to the reduction or prevention of the detection, by the piezoelectric sensor, of noise such as extraneous vibration and impact directly transmitted from, for example, a tire. The piezoelectric sensor is therefore able to detect the deflection of the substrate with high sensitivity. The gap may be filled with rubber or a resin. In this case, the strength of bonding between the substrate and the piezoelectric element is increased.

A piezoelectric element according to a preferred embodiment of the present invention includes a laminate and first and second terminal electrodes that are disposed on different end surfaces of the laminate. The laminate includes a piezoelectric substance, first and second detection electrodes between which the piezoelectric substance is disposed, and an exterior body laminated on the outer side portion of at least one of the first and second detection electrodes. The first detection electrode is connected to the first terminal electrode. The second detection electrode is connected to the second terminal electrode.

Various preferred embodiments of the present invention provide piezoelectric sensors with high sensitivity, less prone to detect noise such as vibration, easily reduced size, and a module structure that is easily integrated in a peripheral circuit.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Piezoelectric sensors according to preferred embodiments of the present invention will be described below with reference to the accompanying drawings.

First Preferred Embodiment

Figure 1:
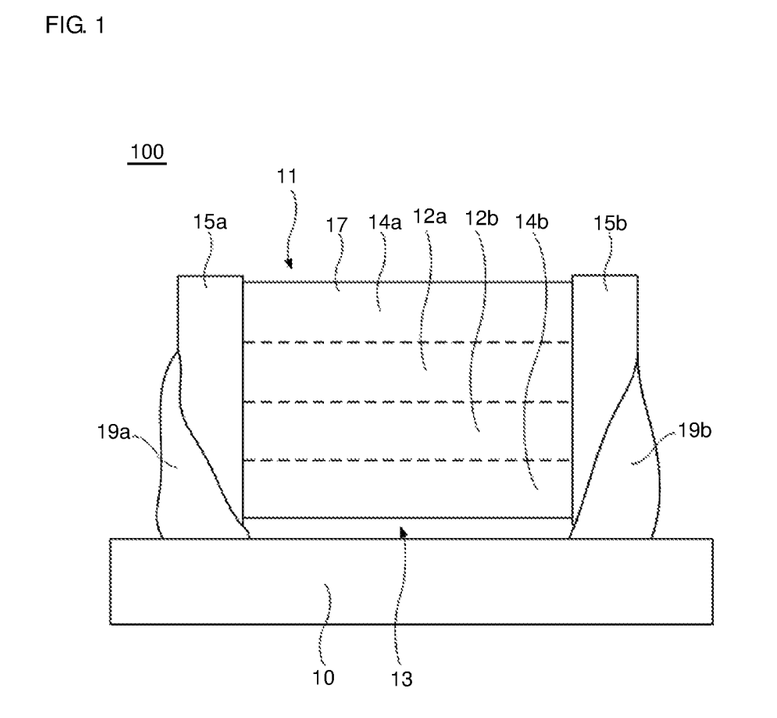
FIG. 1 is a side view of a piezoelectric sensor according to a first preferred embodiment of the present invention.

FIG. 1 is a diagram illustrating a piezoelectric sensor 100 according to a first preferred embodiment of the present invention. The piezoelectric sensor 100 includes a substrate 10 and a piezoelectric element 11 mounted on the substrate 10.

The piezoelectric element 11 preferably has a rectangular or substantially rectangular parallelepiped shape, and includes a laminate 17, a first terminal electrode 15a disposed on one end surface of the laminate 17, and a second terminal electrode 15b disposed on the other end surface of the laminate 17. The first terminal electrode 15a and the second terminal electrode 15b are mounted on the substrate 10 by solders 19a and 19b, respectively, which are an example of bonding materials. Between a portion of the substrate 10 other than a solder mounting portion and the piezoelectric element 11, a gap 13 with a height equal or substantially equal to that of the solder mounted is provided.

Figure 2:
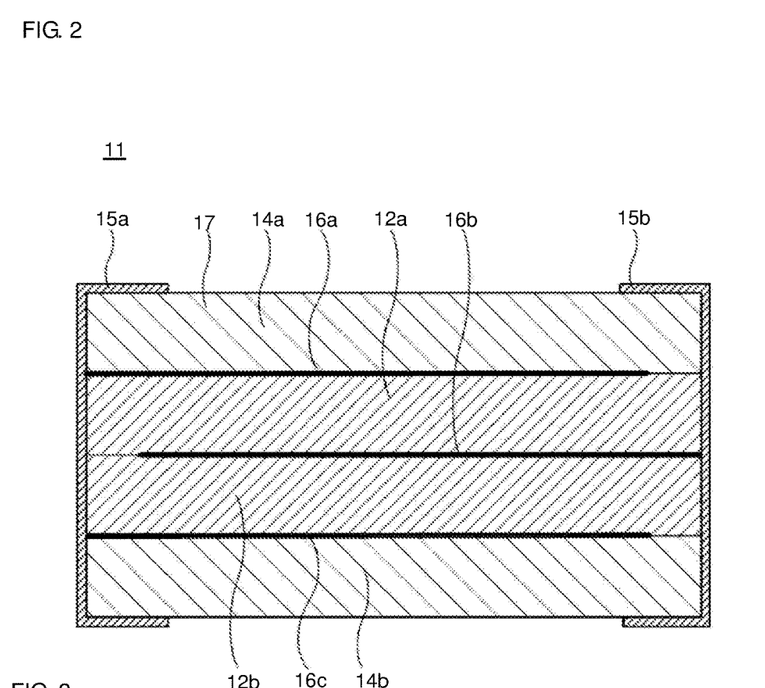
FIG. 2 is a sectional view of a main portion of a piezoelectric element of the piezoelectric sensor according to the first preferred embodiment of the present invention.

As illustrated in FIG. 2, the laminate 17 of the piezoelectric element 11 has a structure obtained by laminating an exterior body 14a, a first detection electrode 16a, a piezoelectric substance 12a, a second detection electrode 16b, a piezoelectric substance 12b, a first detection electrode 16c, and an exterior body 14b in this order from the top and integrating them.

More specifically, the exterior body 14a, the piezoelectric substance 12a including one main surface on which the first detection electrode 16a is provided and the other main surface on which the second detection electrode 16b is provided, the piezoelectric substance 12b including one main surface on which the first detection electrode 16c is provided, and the exterior body 14b are bonded with an adhesive (not illustrated) so as to be integrated.

The piezoelectric substances 12a and 12b are preferably made of, for example, a ceramic material having piezoelectricity. The exterior bodies 14a and 14b are preferably made of, for example, a ceramic material, such as magnesium titanate or an insulating material, for example, a resin material such as glass epoxy. The piezoelectric substances 12a and 12b and the exterior bodies 14a and 14b preferably have a rectangular or substantially rectangular flat plate shape. The piezoelectric substances 12a and 12b have been subjected to poling.

In the first preferred embodiment, the upper main surface of the piezoelectric substance 12a is held by the exterior body 14a and the lower main surface of the piezoelectric substance 12b is supported by the exterior body 14b. The displacement of the piezoelectric substances 12a and 12b in the thickness direction is therefore significantly reduced or prevented. Even where the piezoelectric sensor undergoes an accelerated impact, it more accurately detects a deflection while significantly reducing or preventing the detection of acceleration. On the condition that one of the upper main surface of the piezoelectric substance 12a and the lower main surface of the piezoelectric substance 12b is completely supported, the other of the main surfaces may be partially supported or does not necessarily have to be supported at all.

To increase the sensitivity of deflection detection and improve detection accuracy, it is preferable to use the exterior bodies 14a and 14b having a Young's modulus higher than that of the piezoelectric substances 12a and 12b.

Figure 3:
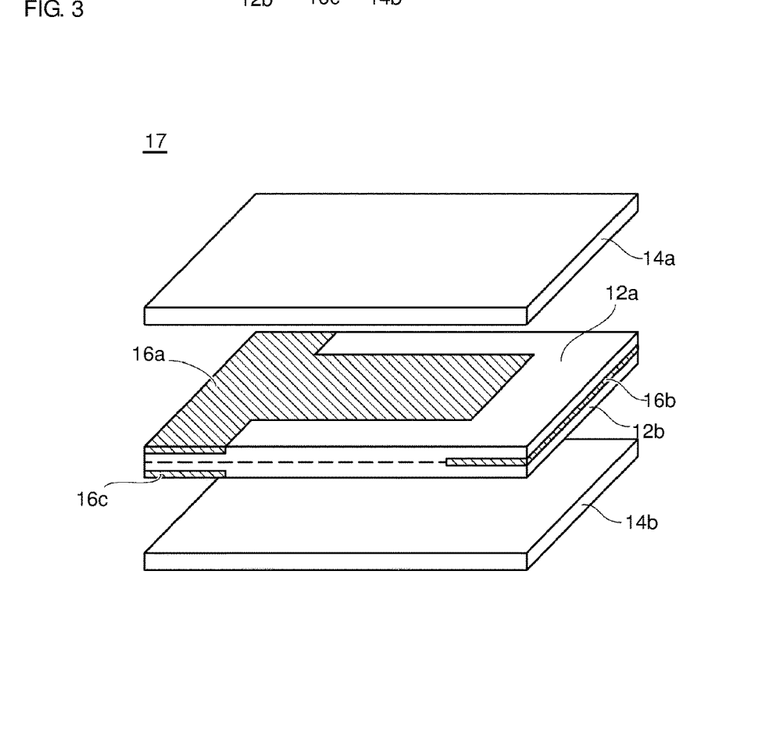
FIG. 3 is an exploded perspective view of a main portion of the piezoelectric sensor according to the first preferred embodiment of the present invention.

In the piezoelectric sensor 100 according to the first preferred embodiment, the first detection electrodes 16a and 16c are externally extended from one end surface of the laminate 17 and two side surfaces on both sides of the end surface. Similarly, the second detection electrode 16b is externally extended from the other end surface of the laminate 17 and two side surfaces on both sides of the end surface.

That is, as illustrated in FIG. 3, the first detection electrodes 16a and 16c and the second detection electrode 16b are externally extended from three surfaces of the laminate 17 to have a T-shape, respectively.

Preferably, each of the first detection electrodes 16a and 16c and the first terminal electrode 15a are connected to each other at not only the end surface but also portions of the side surfaces of the laminate. The reliability of the electrical connection therebetween is therefore high. Preferably, the second detection electrode 16b and the second terminal electrode 15b are connected to each other at not only the end surface but also portions of the side surfaces of the laminate. The reliability of electrical connection therebetween is therefore high. Since each of the first detection electrodes 16a and 16c and the second detection electrode 16b preferably has a T-shape, it is not exposed to the external surface of the laminate 17 except at a portion thereof connected to the first terminal electrode 15a or the second terminal electrode 15b. The first detection electrodes 16a and 16c and the second detection electrode 16b are therefore less susceptible to an external environment such as moisture.

Figure 4:
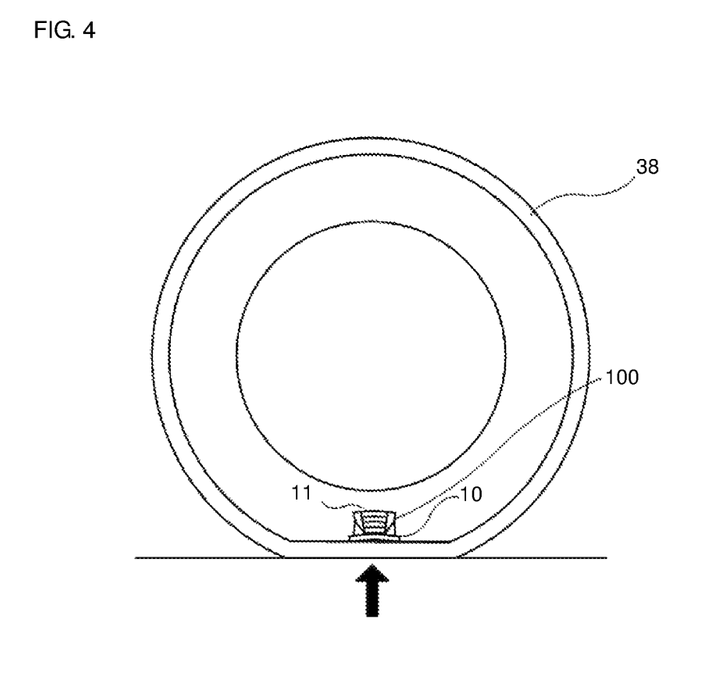
FIG. 4 is a diagram describing a case in which the piezoelectric sensor according to the first preferred embodiment of the present invention is disposed in a tire.

FIG. 4 is a diagram illustrating a state in which the piezoelectric sensor 100 attached to a tire 38 via the substrate 10 detects the deformation of the tire. The piezoelectric sensor 100 detects the deflection of the substrate caused primarily by the deformation of the tire 38 due to the change in the inflation pressure of the tire and the change in road conditions.

As illustrated in FIG. 4, since the tire 38 deforms when being in contact with the ground, the substrate 10 undergoes a deflection in a vertical upward direction from the ground and the deflection causes the piezoelectric element 11 to undergo a deflection in a vertical upward direction from the ground. The degree of the deflections of the substrate 10 and the piezoelectric element 11 depends on the degree of the deformation of the tire 38.

The tire 38 rotates in synchronization with the travel of, for example, a vehicle to which the tire is attached, and a portion of the tire to which the piezoelectric sensor 100 is attached is periodically brought into contact with the ground. Accordingly, the piezoelectric sensor 100 is able to detect the periodic deformation of a tire.

As illustrated in FIG. 1, in the piezoelectric sensor 100, the piezoelectric element 11 is mounted on the substrate 10 at two positions of the first terminal electrode 15a and the second terminal electrode 15b. The size of the substrate 10 is larger than that of the piezoelectric element 11 in plan view. In the piezoelectric sensor 100, the deflection of the substrate 10 is amplified and the amplified deflection causes the piezoelectric element 11 to undergo a deflection. The degree of the deflection of the piezoelectric element 11 is detected by the first detection electrodes 16a and 16c and the second detection electrode 16b as an electric signal. The piezoelectric sensor 100 has high sensitivity because the amplified deflection of the substrate 10 causes the piezoelectric element 11 to undergo a deflection and the deflection of the piezoelectric element 11 is detected as an electric signal.

As illustrated in FIG. 1, in the piezoelectric sensor 100, the gap 13 is provided between the substrate 10 and the piezoelectric element 11. The gap 13 prevents the piezoelectric sensor 100 from detecting noise, such as extraneous vibration and impact directly transmitted from the tire 38. The piezoelectric sensor 100 is able to therefore detect only a deflection with high sensitivity without detecting noise, such as extraneous vibration and impact.

Since the piezoelectric sensor 100 has high sensitivity, the size thereof is able to be reduced. By mounting other electronic components on the substrate 10, the integration of the piezoelectric sensor 100 with a peripheral circuit is able to be easily achieved so as to be made into a module.

Next, the principle of the occurrence of an electric charge at the time of the presence/absence of a deflection will be described with reference to FIGS. 5A, 5B and 6.

Figure 5A:
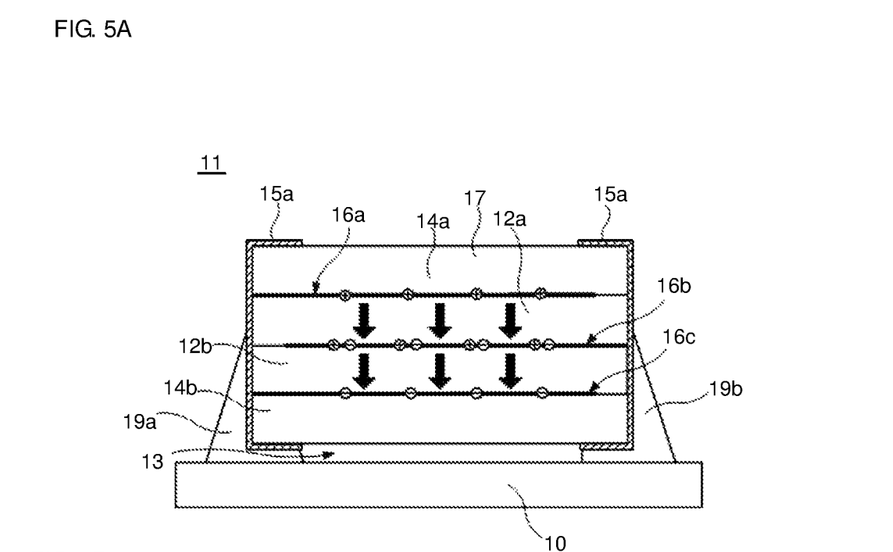
FIGS. 5A and 5B schematically illustrate the deformation state and potential of the piezoelectric sensor according to the first preferred embodiment of the present invention, where FIG. 5A describes a state in which the piezoelectric sensor does not undergo a deflection, and FIG. 5B describes a state in which the piezoelectric sensor undergoes a deflection.
Figure 6:
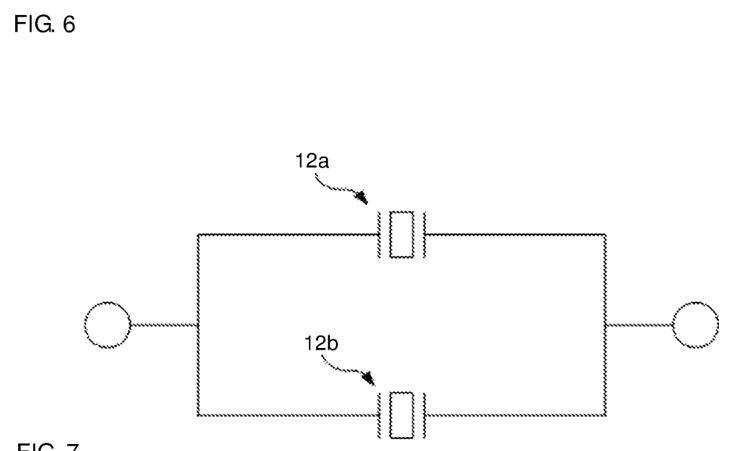
FIG. 6 is an equivalent circuit diagram of a piezoelectric sensor according to the first preferred embodiment of the present invention.

FIG. 5A illustrates a state in which the piezoelectric sensor 100 does not undergo a deflection. A piezoelectric sensor according to the first preferred embodiment may usually be used under an environment where an extreme temperature change occurs. A phenomenon where electric charges are generated by heat, that is, pyroelectricity therefore sometimes occurs. Electric charges generated by pyroelectricity are sometimes mixed with electric charges generated by a deflection. It is therefore preferable that the effect of pyroelectricity be reduced.

As illustrated in FIG. 5A, the piezoelectric sensor 100 according to the first preferred embodiment includes the terminal electrodes 15a and 15b and the detection electrodes 16a, 16b, and 16c and, thus, has a two-layer detection structure. A circuit configuration thereof is illustrated in FIG. 6, and prevents the piezoelectric sensor from being affected by pyroelectricity. That is, the circuit includes a parallel connection of detection portions in two layers so as to cancel electric charges generated by pyroelectricity. Accordingly, only electric charges generated by a deflection are detected.

Figure 5B:
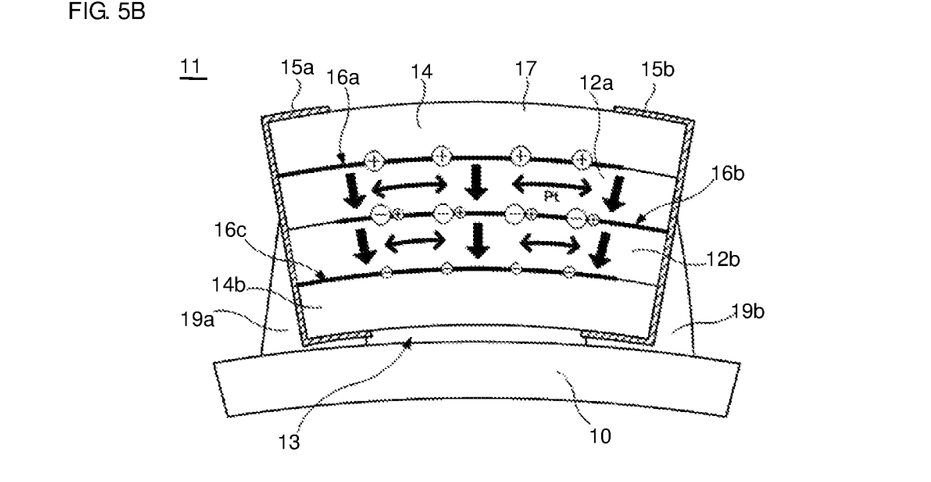

On the other hand, where the piezoelectric sensor 100 undergoes a deflection, the piezoelectric sensor 100 deforms as illustrated in FIG. 5B. As illustrated in FIG. 5B, a tensile stress Pt occurs at the piezoelectric substances 12a and 12b. At the piezoelectric substance 12a, a positive (+) charge and a negative (−) charge occur on the sides of the first detection electrode 16a and the second detection electrode 16b based on the relationship between a polarization direction and the tensile stress Pt. At the piezoelectric substance 12b, a positive (+) charge and a negative (−) charge similarly occur on the sides of the second detection electrode 16b and the first detection electrode 16c based on the relationship between a polarization direction and the tensile stress Pt.

A positive charge generated on the side of the first detection electrode 16a and a negative charge generated on the side of the first detection electrode 16c are transferred to the first terminal electrode 15a. However, since the negative charge generated on the side of the first detection electrode 16c is relatively small, the negative charge and the positive charge generated on the side of the first detection electrode 16a cancel each other and, as a result, only a positive charge is transferred to the first terminal electrode 15a. A negative charge and a positive charge generated on the side of the second detection electrode 16b are transferred to the second terminal electrode 15b. However, since the positive charge is relatively small, the positive charge and the negative charge cancel each other and a remaining negative charge is transferred to the second terminal electrode 15b. As a result, a potential difference occurs between both of the end surfaces, and the deflection of the substrate is detected.

The piezoelectric sensor 100 according to the first preferred embodiment having the above-described configuration is able to be produced in accordance with, for example, the following example procedure.

First, the detection electrodes 16a and 16b are formed at the piezoelectric substance 12a made of, for example, ceramic by screen printing, and the detection electrode 16c is formed at the piezoelectric substance 12b made of, for example, ceramic by screen printing.

The piezoelectric substances 12a and 12b are integrally fired, and poling is performed upon a resultant substance to set a desired polarization direction.

An adhesive, such as an epoxy resin, is applied to both main surfaces of the resultant substance obtained by integrally firing the piezoelectric substances 12a and 12b to laminate and integrally join the exterior body 14a, the piezoelectric substances 12a and 12b, and the exterior body 14b. As a result, the laminate 17 is obtained.

A thin film made of, for example, Ag is formed on both end surfaces of the laminate 17 by, for example, sputtering. Metallic plating is performed upon the thin film to form the terminal electrodes 15a and 15b. As a result, the piezoelectric element 11 is obtained.

The piezoelectric element 11 is mounted on the substrate 10 by soldering, such that the production of the piezoelectric sensor 100 is completed.

The first detection electrode and the second detection electrode preferably have a T-shape in the first preferred embodiment, but may have other shapes, such as an I-shape, for example.

Second Preferred Embodiment

Figure 7:
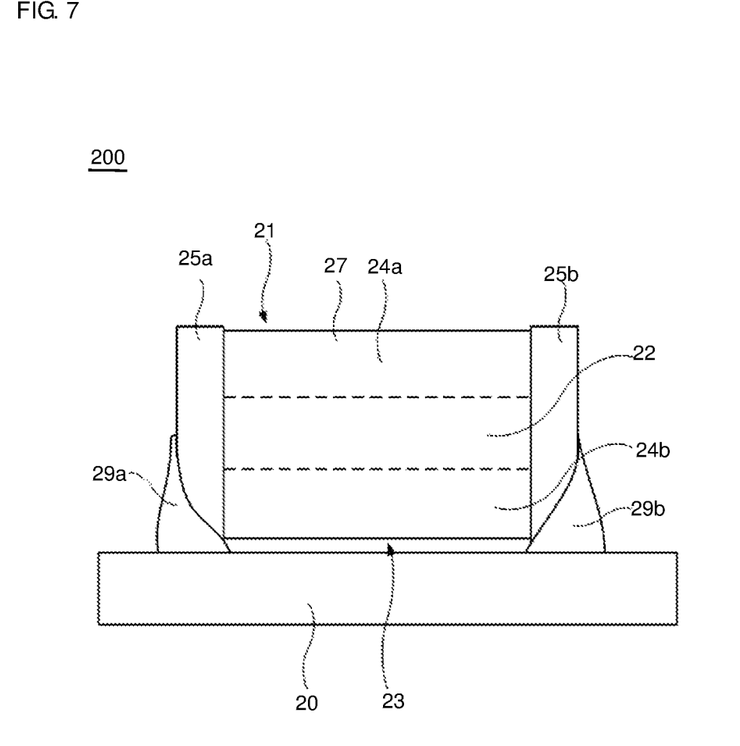
FIG. 7 is a side view of a piezoelectric sensor according to a second preferred embodiment of the present invention.

FIG. 7 is a diagram illustrating a piezoelectric sensor 200 according to a second preferred embodiment of the present invention.

Figure 8A:
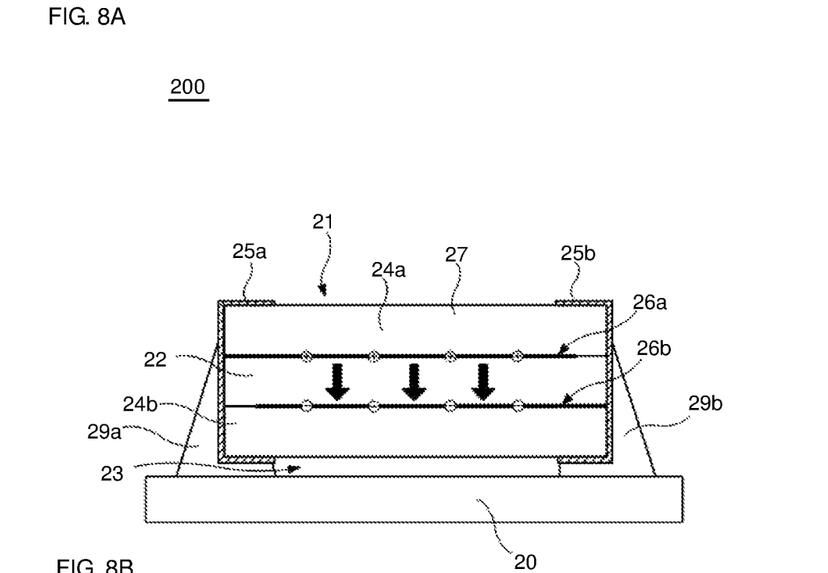
FIGS. 8A and 8B schematically illustrate the deformation state and potential of the piezoelectric sensor according to the second preferred embodiment of the present invention, where FIG. 8A describes a state in which the piezoelectric sensor does not undergo a deflection, and FIG. 8B describes a state in which the piezoelectric sensor undergoes a deflection.
Figure 8B:
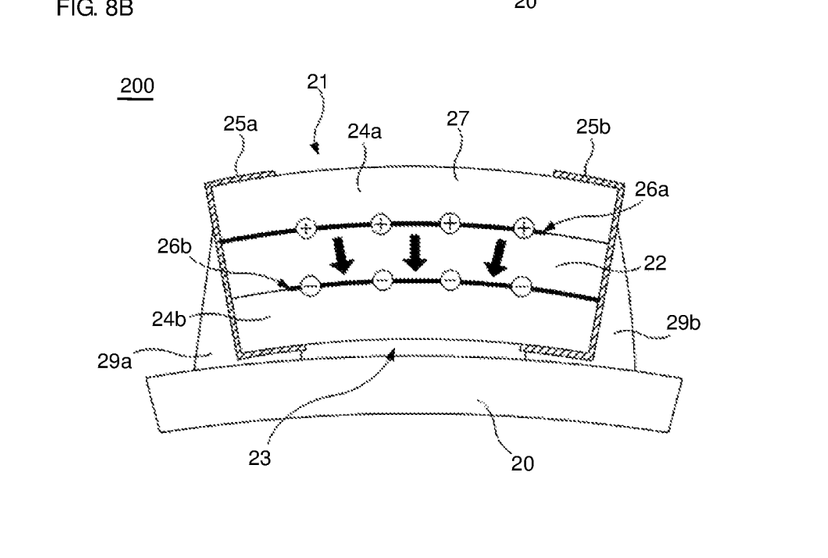

The piezoelectric sensor 200 includes a piezoelectric element 21 instead of the piezoelectric element 11 according to the first preferred embodiment. The piezoelectric element 21 includes a single piezoelectric substance 22. As in the first preferred embodiment, the piezoelectric element 21 includes a laminate 27, a first terminal electrode 25a, and a second terminal electrode 25b. As illustrated in FIG. 8A, the laminate 27 is obtained by laminating an exterior body 24a, a first detection electrode 26a, the piezoelectric substance 22, a second detection electrode 26b, and an exterior body 24b in this order from the top and integrating them. The first terminal electrode 25a and the second terminal electrode 25b are mounted on a substrate 20 by solders 29a and 29b, respectively, which are examples of bonding materials. Between a portion of the substrate 20 other than a solder mounting portion and the piezoelectric element 21, a gap 23 preferably with a height equal or substantially equal to that of the solder mounted is provided.

More specifically, the exterior body 24a, the piezoelectric substance 22 including one main surface on which the first detection electrode 26a is provided and the other main surface on which the second detection electrode 26b is provided, and the exterior body 24b are bonded with an adhesive (not illustrated) so as to be integrated.

Since the numbers of piezoelectric substances and detection electrodes in the piezoelectric sensor 200 are smaller than those in a piezoelectric sensor according to the first preferred embodiment, the piezoelectric sensor 200 is able to be more easily produced at a lower cost.

Third Preferred Embodiment

Figure 9:
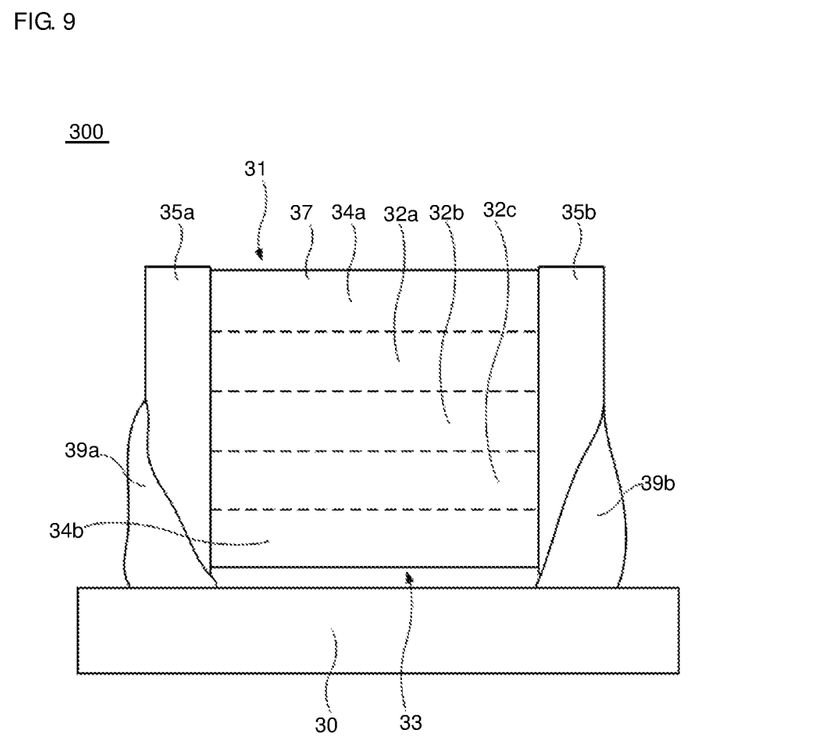
FIG. 9 is a side view of a piezoelectric sensor according to a third preferred embodiment of the present invention.

FIG. 9 is a diagram illustrating a piezoelectric sensor 300 according to a third preferred embodiment of the present invention.

Figure 10A:
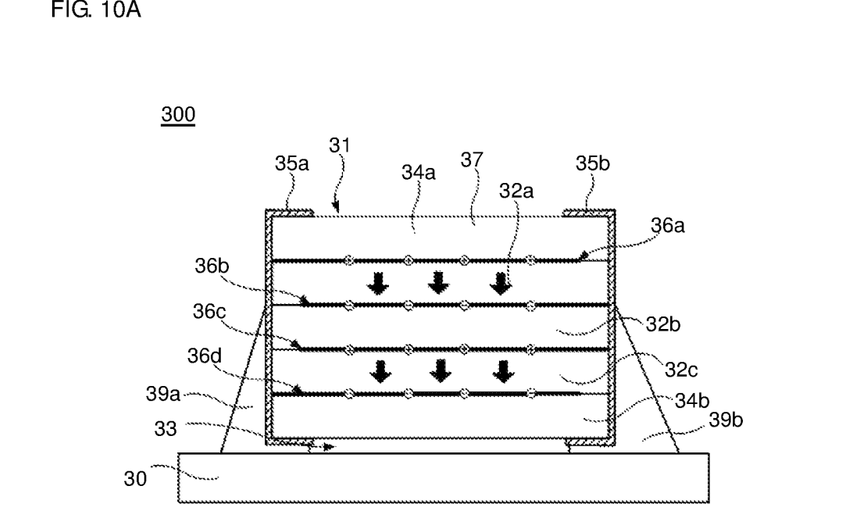
FIGS. 10A and 10B schematically illustrate the deformation state and potential of the piezoelectric sensor according to the third preferred embodiment of the present invention, where FIG. 10A describes a state in which the piezoelectric sensor does not undergo a deflection, and FIG. 10B describes a state in which the piezoelectric sensor undergoes a deflection.
Figure 10B:
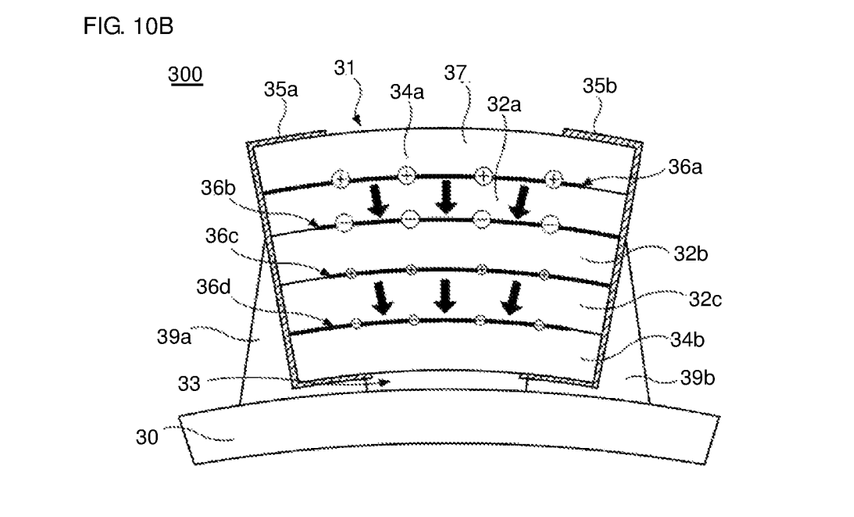

The piezoelectric sensor 300 includes a piezoelectric element 31 instead of the piezoelectric element 11 according to the first preferred embodiment. The piezoelectric element 31 includes three piezoelectric substances 32a, 32b, and 32c. As in the first preferred embodiment, the piezoelectric element 31 includes a laminate 37, a first terminal electrode 35a, and a second terminal electrode 35b. As illustrated in FIG. 10A, the laminate 37 is obtained by laminating an exterior body 34a, a first detection electrode 36a, the piezoelectric substance 32a, a second detection electrode 36b, the piezoelectric substance 32b, a first detection electrode 36c, the piezoelectric substance 32c, a second detection electrode 36d, and an exterior body 34b in this order from the top and integrating them. The first terminal electrode 35a and the second terminal electrode 35b are mounted on a substrate 30 by solders 39a and 39b, respectively, which are examples of bonding materials. Between a portion of the substrate 30 other than a solder mounting portion and the piezoelectric element 31, a gap 33 preferably with a height equal or substantially equal to that of the solder mounted is provided.

More specifically, the exterior body 34a, the piezoelectric substance 32a including one main surface on which the first detection electrode 36a is provided and the other main surface on which the second detection electrode 36b is provided, the piezoelectric substance 32b including one main surface on which the first detection electrode 36c is provided, the piezoelectric substance 32c including one main surface on which the second detection electrode 36d is provided, and the exterior body 34b, are bonded with an adhesive (not illustrated) so as to be integrated.

The piezoelectric substances 32a, 32b, and 32c are subjected to poling. The piezoelectric substance 32b disposed between the piezoelectric substances 32a and 32c does not function as a piezoelectric substance. As the piezoelectric substance 32b, a piezoelectric substance that has not been subjected to poling or an insulator may therefore be used.

Similar to the piezoelectric sensor 100 according to the first preferred embodiment, the piezoelectric sensor 300 cancels electric charges generated by pyroelectricity.

The piezoelectric element 31 in the piezoelectric sensor 300 according to the third preferred embodiment is taller than the piezoelectric element in the piezoelectric sensor 100 according to the first preferred embodiment by the height of the piezoelectric substance 32b. Where the substrate 30 and the substrate 10 according to the first preferred embodiment undergo substantially the same degree of deflection, the degree of deflection of the piezoelectric substance 32a is, therefore, higher than that of the piezoelectric substance 12b. The piezoelectric sensor according to the third preferred embodiment, therefore, has higher deflection detection sensitivity.

Fourth Preferred Embodiment

Figure 11:
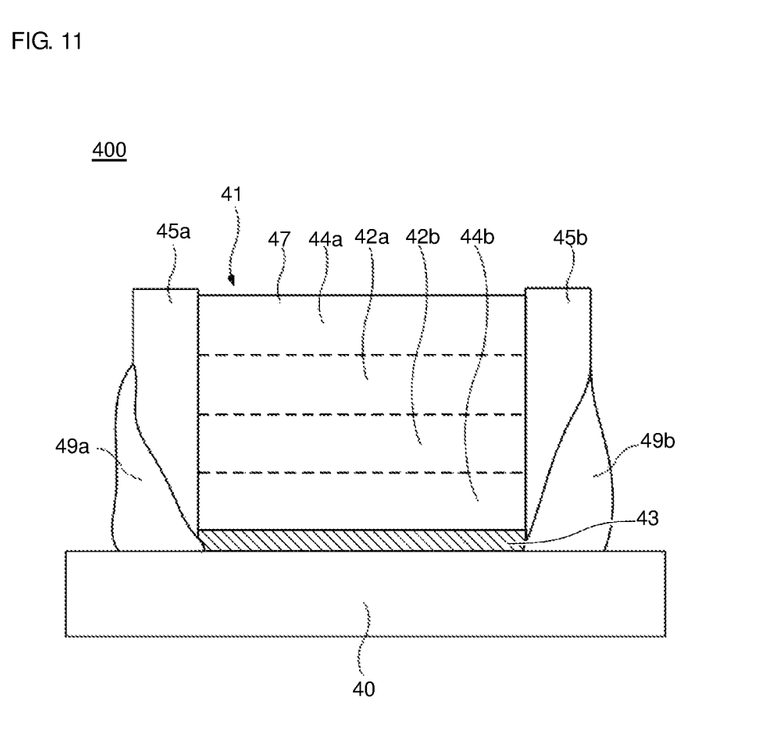
FIG. 11 is a side view of a piezoelectric sensor according to a fourth preferred embodiment of the present invention.

FIG. 11 is a diagram illustrating a piezoelectric sensor 400 according to a fourth preferred embodiment of the present invention.

In the piezoelectric sensor 400, the gap 13 is filled with a resin 43 in the piezoelectric sensor 100 according to the first preferred embodiment. Examples of the resin 43 include a silicone resin and rubber.

As compared with the piezoelectric sensor 100 according to the first preferred embodiment, the piezoelectric sensor 200 according to the second preferred embodiment, and the piezoelectric sensor 300 according to third preferred embodiment, in the piezoelectric sensor 400 according to the fourth preferred embodiment, the strength of bonding between a substrate 40 and a piezoelectric element 41 is increased.

The characteristic configuration of a piezoelectric sensor according to the above-described exemplary preferred embodiments will be summarized as follows.

A piezoelectric sensor includes a substrate and a piezoelectric element. On one main surface of the substrate, a pair of mounting electrodes is provided. The piezoelectric element includes a laminate and first and second terminal electrodes disposed on different end surfaces of the laminate. The laminate includes a piezoelectric substance, first and second detection electrodes between which the piezoelectric substance is disposed, and an insulating exterior body laminated on an outer side portion of at least one of the first and second detection electrodes. The first detection electrode is connected to the first terminal electrode. The second detection electrode is connected to the second terminal electrode. The first terminal electrode is bonded to one of the pair of mounting electrodes by a bonding material. The second terminal electrode is bonded to the other one of the pair of mounting electrodes by a bonding material. Thus, the piezoelectric element is mounted on the substrate.

In a piezoelectric sensor according to a preferred embodiment of the present invention, the first detection electrode may preferably be extended from one of end surfaces of the laminate and two side surfaces connected to the end surface to be connected to the first terminal electrode, and the second detection electrode may preferably be extended from the other one of the end surfaces of the laminate and two side surfaces connected to the end surface to be connected to the second terminal electrode.

In the piezoelectric sensor, a gap may preferably be provided between the substrate and the piezoelectric element.

In the piezoelectric sensor, rubber or a resin may fill a space between the substrate and the piezoelectric element.

The characteristic configuration of a piezoelectric element according to the above-described exemplary preferred embodiments will be summarized as follows. A piezoelectric element includes a laminate and first and second terminal electrodes disposed on different end surfaces of the laminate. The laminate includes a piezoelectric substance, first and second detection electrodes between which the piezoelectric substance is disposed, and an insulating exterior body laminated on an outer side portion of at least one of the first and second detection electrodes. The first detection electrode is connected to the first terminal electrode. The second detection electrode is connected to the second terminal electrode.

It should be understood that the above-described preferred embodiments are illustrative only and are not intended to limit the scope of the present invention. The scope of the present invention should be determined in view of the appended claims. Accordingly, equivalents to the appended claims and all modifications of the present invention which fall within the scope of the present invention are intended to be encompassed in the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric element comprising:
   a laminate including a first end surface and a second end surface at opposite ends of the laminate;
   a first terminal electrode provided on the first end surface; and
   a second terminal electrode provided on the second end surface; wherein
   the laminate includes a piezoelectric substance, first and second detection electrodes that are laminated on the piezoelectric substance so that the piezoelectric substance is disposed between the first detection electrode and the second detection electrode in a direction perpendicular or substantially perpendicular to a direction connecting the first end surface and the second end surface, and an insulating exterior body that is laminated on the piezoelectric substance so that the insulating exterior body is located outside at least one of the first detection electrode and the second detection electrode; and
   the first detection electrode is connected to the first terminal electrode, and the second detection electrode is connected to the second terminal electrode.

2. The piezoelectric element according to claim 1, wherein each of the first detection electrode and the second detection electrode has a T-shape.

3. The piezoelectric element according to claim 1, wherein
   the laminate includes a pair of side surfaces perpendicular or substantially perpendicular to a lamination direction of the laminate and to the direction connecting the first end surface and the second end surface; and
   the first detection electrode is extended to the first end surface and the pair of the side surfaces to be connected to the first terminal electrode, and the second detection electrode is extended to the second end surface and the pair of the side surfaces to be connected to the second terminal electrode.

4. The piezoelectric element according to claim 3, wherein each of the first detection electrode and the second detection electrode has a T-shape.

5. The piezoelectric element according to claim 1, further comprising:
   another piezoelectric substance; and
   two first detection electrodes; wherein
   the piezoelectric substance is sandwiched between one of the first detection electrodes and the second detection electrode, and the another piezoelectric substance is sandwiched between the second detection electrode and the other one of the first detection electrodes.

6. The piezoelectric element according to claim 1, wherein the insulating exterior body is made of one of a ceramic material and a resin material.

7. The piezoelectric element according to claim 1, wherein the insulating exterior body is located outside of both of the first detection electrode and the second detection electrode.

8. The piezoelectric element according to claim 1, wherein each of the first and second terminal electrodes includes a thin film made of Ag.

9. The piezoelectric element according to claim 1, wherein the piezoelectric substance includes only a single piezoelectric substance.

10. The piezoelectric element according to claim 1, wherein the piezoelectric substance is made of a ceramic material having piezoelectricity.

11. A piezoelectric sensor comprising:
    the piezoelectric element according to claim 1; and
    a substrate on which the piezoelectric element is mounted; wherein
    the substrate includes a pair of mounting electrodes on a main surface of the substrate on which the piezoelectric element is mounted; and
    the first terminal electrode is bonded to one of the pair of mounting electrodes via a bonding material, and the second terminal electrode is bonded to the other one of the pair of mounting electrodes via a bonding material.

12. The piezoelectric sensor according to claim 11, wherein a gap is provided between the piezoelectric element and the substrate.

13. The piezoelectric sensor according to claim 12, wherein the gap is filled with a resin.

14. The piezoelectric sensor according to claim 12, wherein the gap has a height equal or substantially equal to a height of the bonding material.

15. The piezoelectric sensor according to claim 11, wherein rubber or a resin fills a space between the piezoelectric element and the substrate.

16. The piezoelectric sensor according to claim 11, wherein the substrate is a tire.

17. The piezoelectric sensor according to claim 11, wherein the bonding material is solder.

* * * * *